US010319867B2

(12) United States Patent
Katase et al.

(10) Patent No.: US 10,319,867 B2
(45) Date of Patent: Jun. 11, 2019

(54) ELECTRONIC COMPONENT, MANUFACTURING METHOD OF ELECTRONIC COMPONENT, AND ELECTRONIC EQUIPMENT

(71) Applicant: CANON KABUSHIKI KAISHA, Tokyo (JP)

(72) Inventors: Yu Katase, Kawasaki (JP); Tadashi Kosaka, Atsugi (JP); Koichi Shimizu, Fujisawa (JP); Shuichi Chiba, Kawasaki (JP); Kazuya Notsu, Yokohama (JP); Yoshifumi Murakami, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/914,131

(22) Filed: Mar. 7, 2018

(65) Prior Publication Data
US 2018/0269336 A1 Sep. 20, 2018

(30) Foreign Application Priority Data

Mar. 17, 2017 (JP) .................................. 2017-052962

(51) Int. Cl.
*H04N 5/225* (2006.01)
*H01L 27/146* (2006.01)
*H01L 31/0203* (2014.01)

(52) U.S. Cl.
CPC .... *H01L 31/0203* (2013.01); *H01L 27/14618* (2013.01); *H04N 5/2253* (2013.01)

(58) Field of Classification Search
CPC .......... H01L 27/14618; H01L 31/0203; H04N 5/2253
See application file for complete search history.

(56) References Cited

U.S. PATENT DOCUMENTS

| 9,171,874 B2 | 10/2015 | Suzuki et al. | |
|---|---|---|---|
| 2005/0018302 A1* | 1/2005 | Yano | G02B 5/281 359/588 |
| 2009/0257123 A1* | 10/2009 | Okazaki | G02B 5/3083 359/513 |
| 2011/0205413 A1* | 8/2011 | Suzuki | H01L 27/14618 348/294 |
| 2011/0254985 A1* | 10/2011 | Hiramoto | G03B 11/00 348/294 |
| 2012/0228497 A1* | 9/2012 | Suzuki | G01J 5/024 250/332 |

(Continued)

FOREIGN PATENT DOCUMENTS

| JP | 7-39232 U | 7/1995 |
|---|---|---|
| JP | 2001-230395 A | 8/2001 |
| JP | 2012-99733 A | 5/2012 |

(Continued)

*Primary Examiner* — Amy R Hsu
(74) *Attorney, Agent, or Firm* — Venable LLP (57) ABSTRACT

Provided is an electronic component including: a base member; an electronic device fixed on the base member; and a lid member arranged over the electronic device and fixed on the base member. A primary material of the lid member is a crystal quartz, the lid member has two primary faces opposing to the electronic device and four side faces, and each of the four side faces is a wet-etched face that is not parallel to an optical axis of the crystal quartz.

20 Claims, 7 Drawing Sheets

(56) References Cited

U.S. PATENT DOCUMENTS

| | | | |
|---|---|---|---|
| 2013/0286566 A1* | 10/2013 | Tsuduki ............... | H05K 5/0091 |
| | | | 361/679.01 |
| 2014/0240588 A1* | 8/2014 | Sakuragi .............. | H04N 5/2252 |
| | | | 348/373 |

FOREIGN PATENT DOCUMENTS

| | | | |
|---|---|---|---|
| JP | 2012099733 A | * | 5/2012 |
| JP | 5347267 B2 | | 11/2013 |
| JP | 5455706 B2 | | 3/2014 |
| JP | 5477066 B2 | | 4/2014 |
| JP | 2015-46418 A | | 3/2015 |
| JP | 2015046418 A | * | 3/2015 |

* cited by examiner

ELECTRONIC COMPONENT, MANUFACTURING METHOD OF ELECTRONIC COMPONENT, AND ELECTRONIC EQUIPMENT

BACKGROUND OF THE INVENTION

Field of the Invention

The present invention relates to an electronic component, a manufacturing method of an electronic component, and electronic equipment.

Description of the Related Art

In electronic components having the structure in which an electronic device such as an image pickup device is mounted in a package, diversification of the usage environment or the like has increased the stress applied to the electronic components from the outside. Thus, there is a demand for improved resistance against a stress to a package for mounting an electronic device.

Japanese Patent Application Laid-Open No. 2001-230395 proposes that the outer circumferential end face of a crystal quartz that is a sealing plate of a package for mounting a solid state imaging device can be smoothed by applying chemical etching thereto.

When there is a flaw or the like on the outer circumferential end face of a crystal quartz used as a lid member of a package for mounting an electronic component, such a flaw or the like may cause a reduction in the strength of the lid member. Since a crystal quartz, which is an anisotropic material, has a crystal direction which is less likely to be etched, etching for removal of a flaw or the like on the end face may result in insufficient removal of some parts of the end face.

SUMMARY OF THE INVENTION

At least one embodiment of the present invention is intended to provide an electronic component having a lid member with an improved strength.

An electronic component according to one aspect of the present invention includes: a base member; an electronic device fixed on the base member; and a lid member arranged over the electronic device and fixed on the base member. A primary material of the lid member is a crystal quartz, the lid member has two primary faces opposing to the electronic device and four side faces, and each of the four side faces is a wet-etched face that is not parallel to an optical axis of the crystal quartz.

An electronic component according to another aspect of the present invention includes: a base member; an electronic device fixed on the base member; and a lid member arranged over the electronic device and fixed on the base member. A primary material of the lid member is a crystal quartz, the lid member has two primary faces opposing to the electronic device and four side faces, none of the four side faces is parallel to an optical axis of the crystal quartz, and at least one of the four side faces is not perpendicular to the two primary faces.

A manufacturing method of an electronic device according to another aspect of the present invention includes: preparing a base member and an electronic device fixed on the base member; preparing a lid member; arranging the lid member over the electronic device and fixing the base member and the lid member. A primary material of the lid member is a crystal quartz, the lid member has two primary faces opposing to the electronic device and four side faces, one of the four side faces is parallel to an optical axis of the crystal quartz, and at least one of the four side faces is not perpendicular to the two primary faces.

A manufacturing method of a lid member of a package for mounting an electronic device according to another aspect of the present invention includes: preparing a crystal quartz plate having two primary faces and four side faces; and wet-etching the four side faces. None of the four side faces is parallel to an optical axis of a crystal quartz.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings. Note that, in the following description and drawings, features common throughout a plurality of drawings are provided with the common reference symbol. Further, such common features may be described with cross-reference to a plurality of drawings. Further, the duplicated description of features provided with a common reference symbol may be omitted or simplified.

First Embodiment

Figure 1:
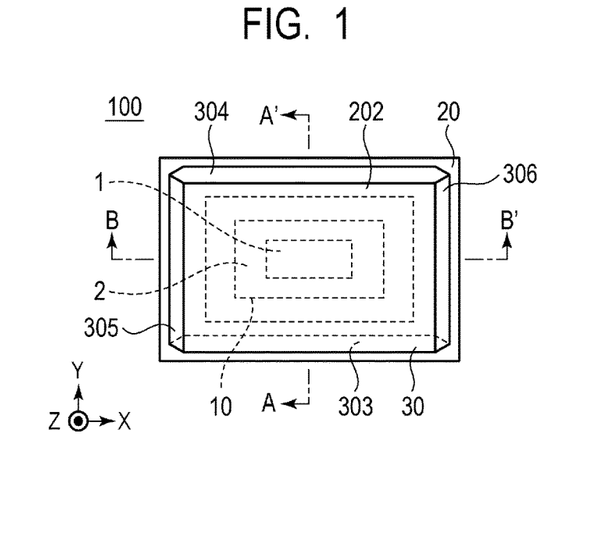
FIG. 1 is a schematic plan view of an electronic component according to a first embodiment.
Figures 2A, 2B:
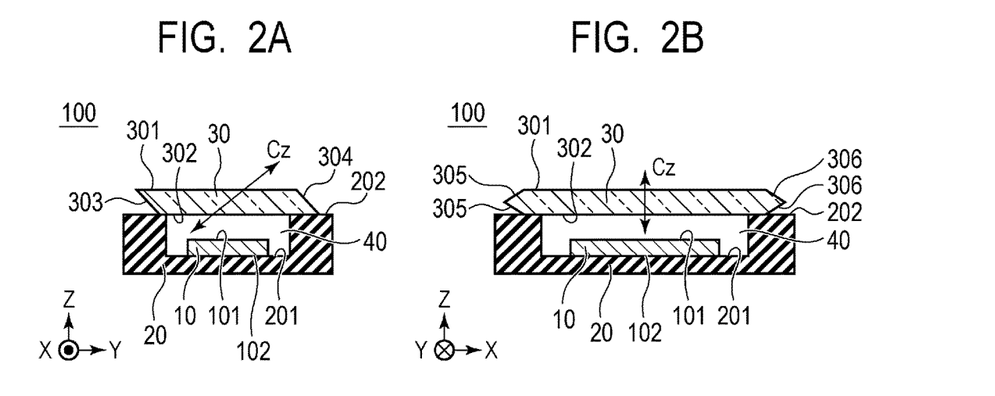
FIG. 2A and FIG. 2B are schematic sectional views of the electronic component according to the first embodiment.

As a first embodiment of the present invention, an example of the structure of an electronic component 100 will be described below. FIG. 1 is a schematic plan view of the electronic component 100. FIG. 2A and FIG. 2B are schematic sectional views of the electronic component 100. FIG. 2A is a schematic sectional view of the electronic component 100 taken along the line A-A' of FIG. 1, and FIG. 2B is a schematic sectional view of the electronic component 100 taken along the line B-B' of FIG. 1. The same member is labeled with the same reference symbol, description will be provided below with cross-reference to respective drawings. Further, each drawing depicts coordinate axes, namely, an X-axis, a Y-axis, and a Z-axis. Note that the positive direction of the Z-axis may be called upper and the negative direction of the Z-axis may be called under.

The electronic component 100 includes an electronic device 10, a base member 20 having a recess on which the electronic device 10 is mounted, and a lid member arranged over the electronic device 10. The primary material of the lid member is a crystal quartz. In the following, the lid member is called a crystal quartz 30. The base member 20 may function as a mounting member that mechanically fixes the electronic component 100 therein and can also be electrically connected to the electronic component 100. The crystal quartz 30 may function as an optical member in addition to as a lid member of a package. As illustrated in FIG. 2A and FIG. 2B, the electronic device 10 is mounted on a recess bottom 201 inside the base member 20, and a back face 102 of the electronic device 10 and the recess bottom 201 inside the base member 20 are fixed by an adhesion (not shown). The crystal quartz 30 is fixed to a frame upper face 202 of the base member 20 by the adhesive (not shown), and thereby an internal space 40 surrounded by the base member 20 and the crystal quartz 30 is formed. The crystal quartz 30 is arranged over the electronic device 10 and faces the electronic device 10 via the internal space 40. The crystal 30 has an outer face 301 and an inner face 302 that are two primary faces opposing to the electronic device 10, and the inner face 302 faces a front face 101 of the electronic device 10.

Each of the front face 101 of the electronic device 10, the back face 102 of the electronic device 10, the outer face 301 of the crystal quartz 30, and the inner face 302 of the crystal quartz 30 is a face parallel to the X-axis direction and the Y-axis direction and perpendicular to the Z-axis direction. Each shape of the electronic device 10 and the electronic component 100 is a quadrilateral having four sides in the X-axis direction and the Y-axis direction in a planar view from the Z-axis direction. Therefore, each shape of the front face 101 of the electronic device 10, the back face 102 of the electronic device 10, the outer face 301 of the crystal quartz 30, and the inner face 302 of the crystal quartz 30 is a quadrilateral having four sides in the X-axis direction and the Y-axis direction in a planar view from the Z-axis direction. Further, each size of the electronic device 10 and the electronic component 100 in the Z-axis direction is smaller than the sizes in the X-axis direction and the Y-axis direction, and thus the electronic device 10 and the electronic component 100 each have a flat plate shape.

While the type and the function of the electronic device 10 are not limited in particular, the electronic device 10 is typically an optical device. The electronic device 10 of the present embodiment has a primary region 1 and a secondary region 2. Typically, the primary region 1 is located in the center of the electronic device 10 in a planar view from the Z-axis direction, and the secondary region 2 is located in the periphery thereof. When the electronic device 10 is an image pickup device such as a CCD image sensor or a CMOS image sensor, the primary region 1 is an image pickup region, and the secondary region 2 is a peripheral circuit region. When the electronic device 10 is a display device such as a liquid crystal display or an EL display, the primary region 1 is a display region, and the secondary region 2 is a peripheral circuit region. When the electronic device 10 is an image pickup device, the front face 101 of the electronic device 10 is a light incident face. This light incident face can be formed including a multilayer film provided on the semiconductor substrate. The multilayer film may include a layer having an optical function such as a color filter layer, a micro-lens layer, an antireflection layer, or a light-shielding layer, a layer having a mechanical function such as a planarization layer, a layer having a chemical function such as a passivation layer, or the like. The secondary region 2, which is a peripheral circuit region, is provided with a drive circuit for driving the primary region 1, a signal processing circuit for processing a signal output from the primary region 1 (or a signal output to the primary region 1), or the like. When the electronic device is a semiconductor device formed on a semiconductor substrate, since the above circuits are easily formed in a monolithic manner, the electronic device 10 is typically a semiconductor device.

The base member 20 has a recess in which the electronic device 10 is mounted. The base member 20 can be formed by a method such as metallic molding, cutting, or plate lamination. While the base member 20 may be a conductor such as a metal plate, the base member 20 is preferably an insulator. While the base member 20 may be a flexible substrate such as a polyimide substrate, the base member 20 is preferably a rigid substrate such as a glass epoxy substrate, a composite substrate, a glass composite substrate, a Bakelite substrate, or a ceramic substrate. It is particularly preferable for the base member 20 to be a ceramic substrate, and it is preferable to use a ceramic laminate as the base member 20. As an example of the ceramic material, silicon carbide, aluminum nitride, sapphire, alumina, silicon nitride, cermet, yttria, mullite, forsterite, cordierite, zirconia, steatite, or the like may be used.

The electronic device 10 is electrically connected to the base member 20 and electrically connected to an external circuit via external terminals (not shown) provided to the base member 20. It is possible to use a Land Grid Array (LGA), a Pin Grid Array (PGA), a Ball Grid Array (BGA), a Leadless Chip Carrier (LCC), or a lead frame for the external terminal. The external terminal and the external circuit can be connected by reflow soldering using solder paste. In such a way, the electronic component 100 is secondarily mounted to form an electronic module. Surface mounting is preferable as a form of mounting. The electronic module is embedded in a casing, and thereby electronic equipment is formed.

The crystal quartz 30 has side faces 303 and 304 parallel to the X-axis direction and side faces 305 and 306 parallel to the Y-axis direction. The side faces 303, 304, 305, and 306 are side faces that correspond to the four sides of the outer face 301 and the inner face 302 of the crystal quartz 30, respectively, and form outer circumferential end faces of the crystal quartz 30. An optical axis Cz illustrated by an arrow in FIG. 2A represents a direction of the optical axis of the crystal quartz 30. A coating such as an antireflection coating or an infrared cut coating may be applied on the outer face 301 and the inner face 302 of the crystal quartz 30.

The crystal quartz 30 is formed as a crystal quartz plate having a predetermined shape by being cut out of an ingot by mechanical machining such as grinding. However, the side faces 303, 304, 305, and 306 obtained immediately after mechanical machining such as grinding is applied thereto may have a defect such as a flaw or a crack on the mechanically machined face. Thus, when the crystal quartz 30 is fixed to the base member 20 to form the electronic component 100 and a stress is then applied thereto from the external environment, the crystal quartz 30 may be damaged from the defect such as a flaw or a crack as a starting point. Thus, in order to remove such a defect, at least the side faces 303, 304, 305, and 306 of the crystal quartz 30 are wet-etched by being exposed to ammonium fluoride, hydrofluoric acid, a mixture liquid thereof, or the like. This can remove a defect such as a flaw or a crack and smooth the side faces 303, 304, 305, and 306 allowing for a reduction of occurrence of damage in the crystal quartz 30, and therefore the electronic component 100 having a lid member with an improved strength can be provided. Note that, in the present specification, a face to which wet etching has been applied may be called a wet-etched face.

On the other hand, a crystal quartz is an anisotropic material. Thus, a crystal quartz has a direction in which the crystal quartz is easily wet-etched and a direction in which the crystal quartz is less likely to be wet-etched depending on the crystal direction. In order to further ensure removal of a defect such as a flaw or a crack for all the side faces 303, 304, 305, and 306 of the crystal quartz 30, it is preferable to select a cut direction of the crystal quartz 30 so that all the side faces 303, 304, 305, and 306 are the faces which are easily etched.

Figure 3:
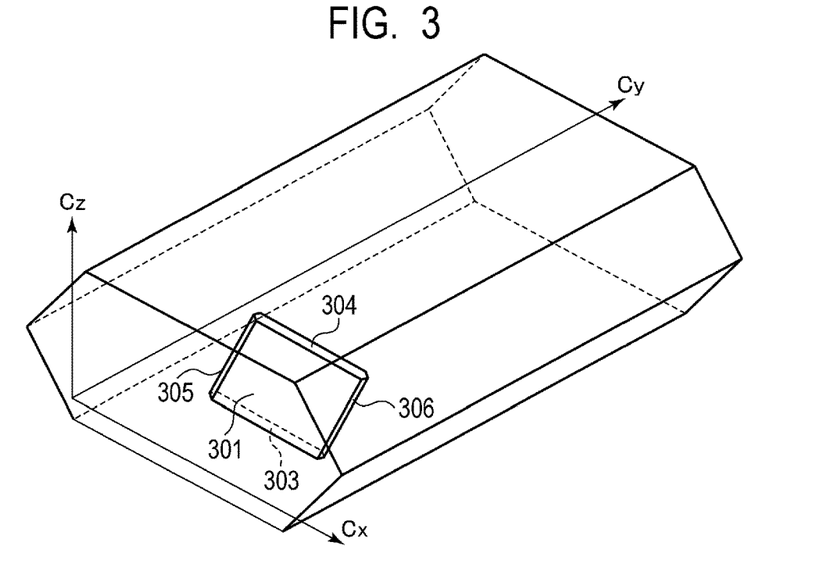
FIG. 3 is a diagram illustrating crystal axes of a crystal quartz according to the first embodiment.

FIG. 3 is a diagram illustrating crystal axes of the crystal quartz 30. FIG. 3 schematically illustrates an electric axis Cx, a mechanical axis Cy, and an optical axis Cz of a crystal quartz that are orthogonal to each other. The crystal growth direction of an ingot of a crystal quartz is the optical axis Cz direction. Further, the face perpendicular to the optical axis Cz is a face which is easily etched, and the face parallel to the optical axis Cz is a face which is less likely to be etched. That is, in order to remove a defect such as a flaw or a crack by wet etching, it is preferable for the wet-etched face to be a face not parallel to the optical axis Cz. Furthermore, the effect is greater when the angle of that wet-etched face relative to the optical axis Cz is closer to perpendicular, and the effect is smaller when the angle of that wet-etched face relative to the optical axis Cz is closer to parallel. That is, in the present embodiment, the cut direction can be selected so that all the side faces 303, 304, 305, and 306 of the crystal quartz 30 are faces not parallel to the optical axis Cz. Thereby, a defect such as a flaw or a crack on all the side faces can be suitably removed by wet etching.

Figure 4A:
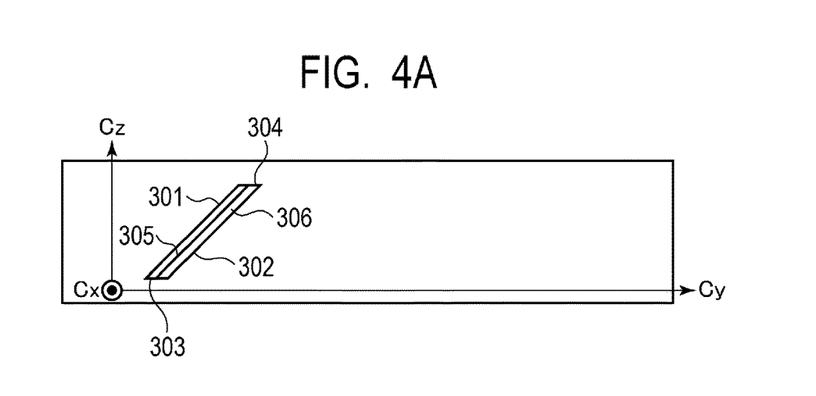
FIG. 4A and FIG. 4B are diagrams illustrating crystal axes of a crystal quartz according to the first embodiment.
Figure 4B:
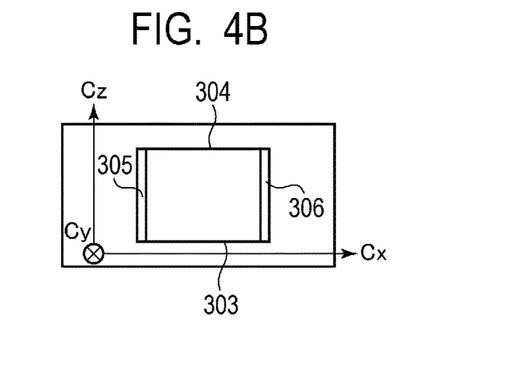

FIG. 4A illustrates the crystal quartz 30 viewed from the positive direction of the electric axis Cx, and FIG. 4B illustrates the crystal quartz 30 viewed from the negative direction of the mechanical axis Cy. As illustrated in FIG. 4A and FIG. 4B, none of the side faces 303, 304, 305, and 306 is parallel to the optical axis Cz. When the electronic device 10 is an image pickup device, the crystal quartz 30 has a function of a low-pass filter used to reduce moire and false colors. In the present embodiment, the angles of the outer face 301 and the inner face 302 relative to the optical axis Cz are not limited. With each of the outer face 301 and the inner face 302 being a face whose angle relative to the optical axis Cz is 45 degrees, however, the maximum separation range can be obtained. Thus, when taking a machining error, an angle distribution of an incident light, or the like into consideration, it is preferable for each of the outer face 301 and the inner face 302 to be a face whose angle relative to the optical axis Cz is greater than or equal to 40 degrees and less than or equal to 50 degrees.

While the side faces 303 and 304 are faces perpendicular to the optical axis Cz in the present embodiment, the embodiment is not limited thereto. For example, the side faces 303 and 304 may be faces perpendicular to the outer face 301 and the inner face 302. With the side faces 303 and 304 being closer to perpendicular to the optical axis Cz, however, the effect of removing a defect such as a flaw or a crack by wet etching can be improved. Therefore, as described in the present embodiment, with the side faces 303 and 304 being faces substantially perpendicular to the optical axis Cz, the defect removal effect can be obtained to the maximum. Note that the reference "substantially perpendicular" in the present specification is intended to include a range which can be said to be essentially perpendicular. Typically, it includes a range between −5 degrees from perpendicular and +5 degrees from perpendicular (greater than or equal to 85 degrees and less than or equal to 95 degrees). The same applies to the reference "substantially parallel" or the like.

When the side faces 305 and 306 are arranged as faces which are perpendicular to the outer face 301 and the inner face 302, the side faces 305 and 306 are faces parallel to the optical axis Cz and therefore less likely to be wet-etched. In order to avoid this, the side faces 305 and 306 are arranged as faces which are not perpendicular to the outer face 301 and the inner face 302 in the present embodiment.

It is here preferable for each of the side faces 305 and 306 to be a face whose angle relative to the optical axis Cz is close to perpendicular in terms of easier wet etching. Since each of the side faces 305 and 306 is required to have an angle close to parallel to the outer face 301 and the inner face 302, this results in a larger external shape of the crystal quartz 30. In order to avoid an unnecessary increase in the size of the crystal quartz 30, it is preferable for the angles of the side faces 305 and 306 relative to the optical axis Cz to be less than or equal to 60 degrees. In addition, when the angles of the side faces 305 and 306 relative to the optical axis Cz are less than 30 degrees, the effect of removing a defect such as a flaw or a crack by wet etching may be insufficient. It is therefore preferable for the angles of the side faces 305 and 306 relative to the optical axis Cz to be greater than or equal to 30 degrees and less than or equal to 60 degrees.

In the first embodiment, as illustrated in FIG. 2B, the side face 305 is formed of two faces, and the side face 306 is also formed of two faces. One of the faces of the side face 305 is formed as a face extending outward (in the negative direction of the X-axis) from the end of the outer face 301 and forming an angle greater than or equal to 30 degrees and less than or equal to 60 degrees relative to the optical axis Cz. The other face of the side face 305 is formed as a face extending outward (in the negative direction of the X-axis) from the end of the inner face 302 and forming an angle greater than or equal to 30 degrees and less than or equal to 60 degrees relative to the optical axis Cz. Similarly, one of the faces of the side face 306 is formed as a face extending outward (in the positive direction of the X-axis) from the end of the outer face 301 and forming an angle greater than or equal to 30 degrees and less than or equal to 60 degrees relative to the optical axis Cz. The other face of the side face 306 is formed as a face extending outward (in the positive direction of the X-axis) from the end of the inner face 302 and forming an angle greater than or equal to 30 degrees and less than or equal to 60 degrees relative to the optical axis Cz. Thereby, it is possible to have the same effect of the wet etching while reducing the size of the external shape compared to the case where each of the side faces 305 and 306 is formed of a single face. In this case, the sectional shape of the crystal quartz 30 in a plane perpendicular to the outer face 301 and the inner face 302 and perpendicular to the sides of the side faces 305 and 306 (in other words, the sectional shape of the crystal quartz 30 illustrated in FIG. 2B) has a hexagonal shape.

Note that, while one of the faces and the other face of the side face 305 form the same angle relative to the optical axis Cz as illustrated in FIG. 2B, the angles may be different from each other as long as each of the angles relative to the optical axis Cz ranges from 30 degrees to 60 degrees. Similarly, the angles of one of the faces and the other face of the side face 306 relative to the optical axis Cz may be different from each other as long as each of the angles relative to the optical axis Cz ranges from 30 degrees to 60 degrees.

As discussed above, according to the present embodiment, since none of the side faces of the crystal quartz 30 is parallel to the optical axis of the crystal quartz, wet etching of these side faces allows for effective removal of a defect such as a flaw or a crack. A use of the crystal quartz 30 obtained in such a way as a lid member of the electronic component 100 improves the strength of the lid member, and thereby the electronic component 100 with reduced occurrence of damage can be provided.

Note that, in FIG. 4A and FIG. 4B, the longer side direction of the outer face 301 and the inner face 302 is parallel to the electric axis Cx. Thus, the areas of the side faces 303 and 304 corresponding to the longer sides are larger than the areas of the side faces 305 and 306 corresponding to the shorter sides. As described above, the side faces 303 and 304 in the longer side direction are perpendicular to the optical axis Cz, which allows for a great effect of removing a defect such as a flaw or a crack by wet etching. By increasing the area of such faces, the advantage of an increased effect with wet etching can be obtained. However, the embodiment is not limited thereto, and the shorter side direction of the outer face 301 and the inner face 302 may be parallel to the electric axis Cx. The relationship of the shorter sides and the longer sides of the outer face 301 and the inner face 302 to the electric axis Cx can be selected properly from various points of view such as in terms of the optimal number of crystal quartzes 30 cut out of a crystal quartz ingot.

Second Embodiment

Figure 5A:
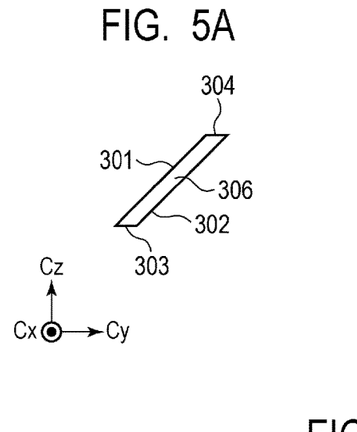
FIG. 5A and FIG. 5B are diagrams illustrating crystal axes of a crystal quartz according to a second embodiment.
Figure 5B:
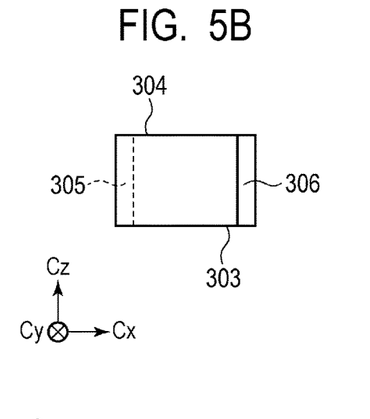
Figure 6:
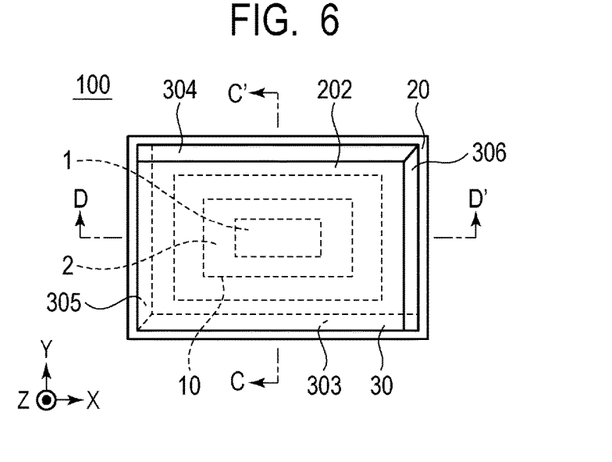
FIG. 6 is a schematic plan view of an electronic component according to the second embodiment.
Figure 7A:
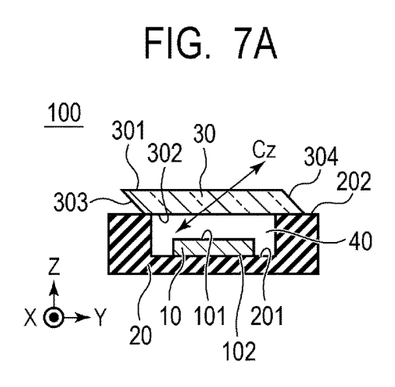
FIG. 7A and FIG. 7B are schematic sectional views of the electronic component according to the second embodiment.
Figure 7B:
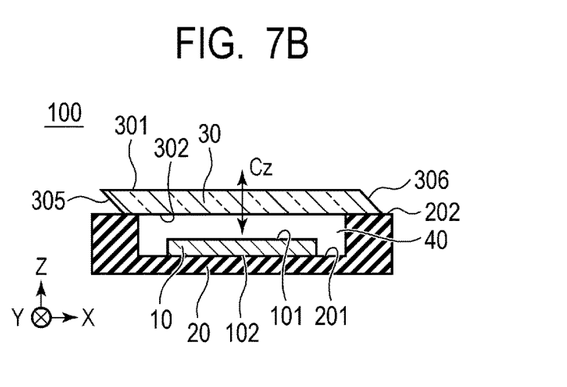

As a second embodiment of the present invention, an example of the structure of the electronic component 100 will be described below. The second embodiment is different from the first embodiment in the shape of the crystal quartz 30. Since other structure is common to the first embodiment, the description thereof will be omitted. FIG. 5A illustrates the crystal quartz 30 viewed from the positive direction of the electric axis Cx, and FIG. 5B illustrates the crystal quartz 30 viewed from the negative direction of the mechanical axis Cy. FIG. 6 is a schematic plan view of the electronic component 100. FIG. 7A is a schematic sectional view of the electronic component 100 taken along the line C-C' of FIG. 6, and FIG. 7B is a schematic sectional view of the electronic component 100 taken along the line D-D' of FIG. 6. The configuration of the second embodiment will be described below with cross-reference to these drawings.

The difference of the shape of the crystal quartz of the present embodiment from that of the first embodiment is in the shape of the side faces 305 and 306 of the crystal quartz 30. More specifically, the side face 305 extends outward from the end of the inner face 302 (in the negative direction of the X-axis) and is formed as a face not parallel to the optical axis Cz. The side face 306 extends outward from the end of the outer face 301 (in the positive direction of the X-axis) and is formed as a face not parallel to the optical axis Cz. In this case, the sectional shape of the crystal quartz 30 in a plane perpendicular to the outer face 301 and the inner face 302 and perpendicular to the sides of the side faces 305 and 306 (in other words, the sectional shape of the crystal quartz 30 illustrated in FIG. 7B) has a shape of a parallelogram which is not a rectangle. Note that, also in the present embodiment, it is preferable for each angle of the side faces 305 and 306 relative to the optical axis Cz to be greater than or equal to 30 degrees and less than or equal to 60 degrees for the same reasons as in the first embodiment.

Also in the present embodiment, similarly to the first embodiment, since none of the side faces of crystal quartz 30 is parallel to the optical axis Cz of the crystal quartz, wet etching of these side faces allows for effective removal of a defect such as a flaw or a crack. A use of the crystal quartz 30 obtained in such a way as a lid member of the electronic component 100 improves the strength of the lid member, and thereby the electronic component 100 with reduced occurrence of damage can be provided. Furthermore, in the present embodiment, since the number of faces of the side faces in the outer circumferential end face of the crystal quartz 30 is less than that of the first embodiment, the number of steps in machining of the crystal quartz 30 can be reduced. It is therefore possible to prepare the crystal quartz 30 and manufacture the electronic component 100 with lower cost, and thereby it is possible to further reduce the cost of the electronic component 100.

Third Embodiment

Figure 8A:
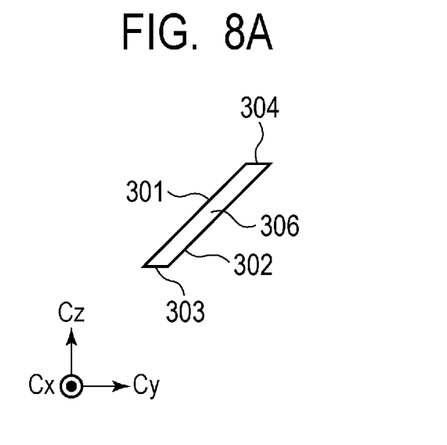
FIG. 8A and FIG. 8B are diagrams illustrating crystal axes of a crystal quartz according to a third embodiment.
Figure 8B:
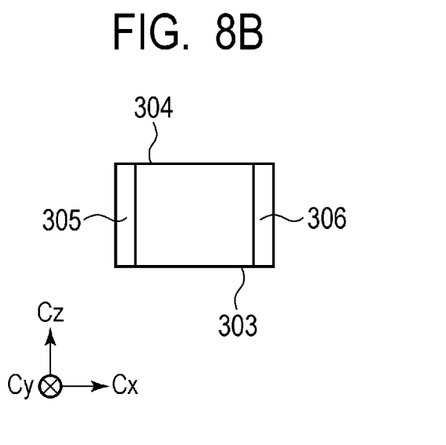
Figure 9A:
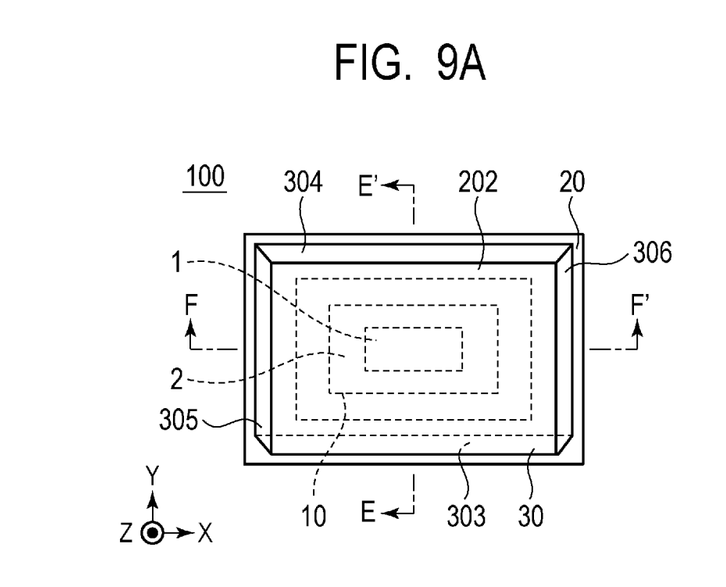
FIG. 9A and FIG. 9B are schematic plan views of an electronic component according to the third embodiment.
Figure 9B:
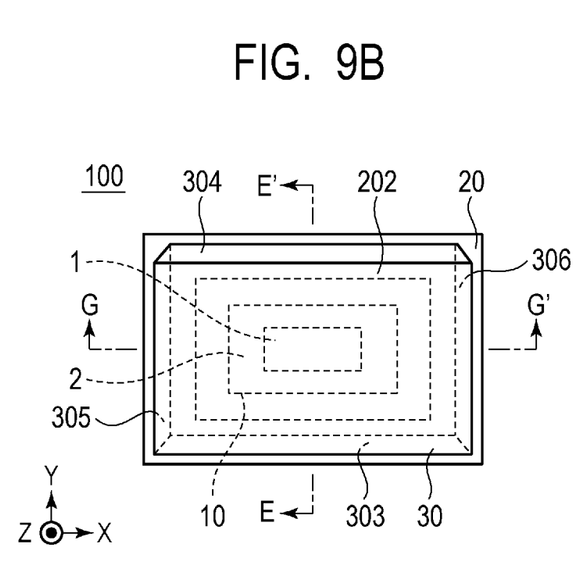
Figure 10A:
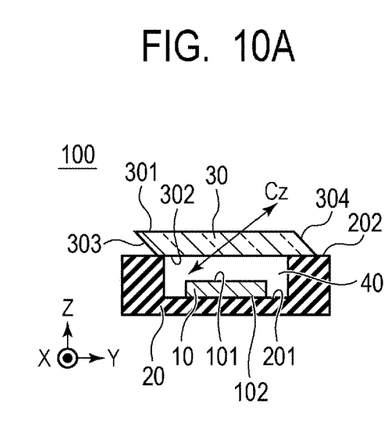
FIG. 10A, FIG. 10B, and FIG. 10C are schematic sectional views of the electronic component according to the third embodiment.
Figure 10B:
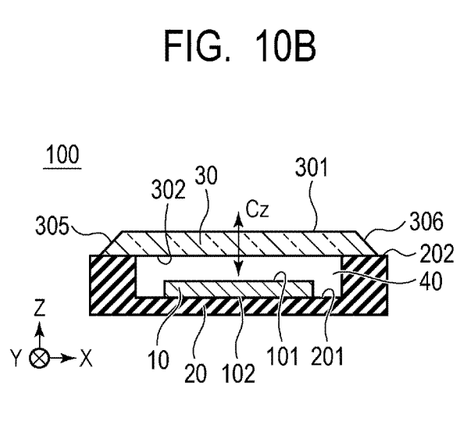
Figure 10C:
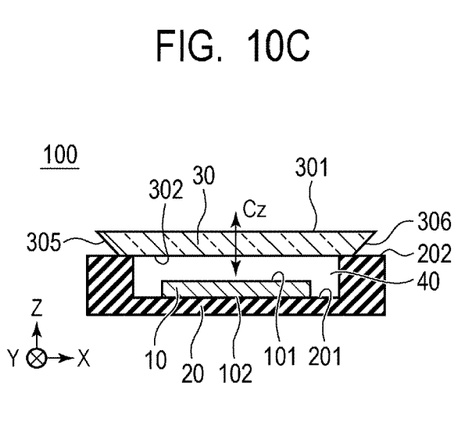

As a third embodiment of the present invention, an example of the structure of the electronic component 100 will be described below. The third embodiment is different from the first embodiment and the second embodiment in the shape of the crystal quartz 30. Since other structure is common to the first embodiment, the description thereof will be omitted. FIG. 8A illustrates the crystal quartz 30 viewed from the positive direction of the electric axis Cx, and FIG. 8B illustrates the crystal quartz 30 viewed from the negative direction of the mechanical axis Cy. FIG. 9A and FIG. 9B are schematic plan views of the electronic component 100. FIG. 10A is a schematic sectional view of the electronic component 100 taken along the line E-E' of FIG. 9A and FIG. 9B, and FIG. 10B is a schematic sectional view of the electronic component 100 taken along the line F-F' of FIG. 9A. FIG. 10C is a schematic sectional view of the electronic component 100 taken along the line G-G' of FIG. 9B. The configuration of the third embodiment will be described below with cross-reference to these drawings. FIG. 9A and corresponding FIG. 10A and FIG. 10B illustrate a first configuration example of the third embodiment, and FIG. 9B and corresponding FIG. 10A and FIG. 10C illustrate a second configuration example of the third embodiment.

The difference of the shape of the crystal quartz of the present embodiment from that of the first embodiment is in the shape of the side faces 305 and 306 of the crystal quartz 30. In the first configuration example illustrated in FIG. 9A, FIG. 10A, and FIG. 10B, the side face 305 extends outward (in the negative direction of the X-axis) from the end of the outer face 301 and is formed as a face not parallel to the optical axis Cz. The side face 306 extends outward (in the positive direction of the X-axis) from the end of the outer face 301 and is formed as a face not parallel to the optical axis Cz. In the second configuration example illustrated in FIG. 9B, FIG. 10A, and FIG. 10C, the side face 305 extends outward (in the negative direction of the X-axis) from the end of the inner face 302 and is formed as a face not parallel to the optical axis Cz. The side face 306 extends outward (in the positive direction of the X-axis) from the end of the inner face 302 and is formed as a face not parallel to the optical axis Cz. In each of the first configuration example and the second configuration example, the sectional shape of the crystal quartz 30 in a plane perpendicular to the outer face 301 and the inner face 302 and perpendicular to the sides of the side faces 305 and 306 (see FIG. 10B and FIG. 10C) has a shape of a trapezoid which is not a parallelogram. In the first configuration example, the longer base of the two parallel sides forming two bases of the trapezoid is a side on the side fixed to the frame upper face 202. In the second configuration example, the shorter base of the two parallel sides forming two bases of the trapezoid is a side on the side fixed to the frame upper face 202. Note that, also in the first configuration example and the second configuration example of the present embodiment, it is preferable for the angles of the side faces 305 and 306 relative to the optical axis Cz to be greater than or equal to 30 degrees and less than or equal to 60 degrees for the same reasons as in the first embodiment and the second embodiment.

Also in the present embodiment, similarly to the first embodiment, since none of the side faces of the crystal quartz 30 is parallel to the optical axis of the crystal quartz, wet etching of these side faces allows for effective removal of a defect such as a flaw or a crack. A use of the crystal quartz 30 obtained in such a way as a lid member of the electronic component 100 improves the strength of the lid member, and thereby the electronic component 100 with reduced occurrence of damage can be provided. Furthermore, in the first configuration example of the present embodiment, since the frame upper face 202 and the crystal quartz 30 can be fixed without a gap therebetween, this can reduce occurrence of damage such as a crack or a chip of the outer circumference due to handling such as mounting. In the second configuration example of the present embodiment, each spatial gap between the frame upper face 202 and the side faces 305 and 306 can be utilized as an adhesion region for fixation. Thus, the contact area between the inner face 302 of the crystal quartz 30 and the frame upper face 202 can be reduced compared to that of the first embodiment, the second embodiment, and the first configuration example of the present embodiment, which allows for a reduction in the size of the electronic component 100.

Fourth Embodiment

Figure 11A:
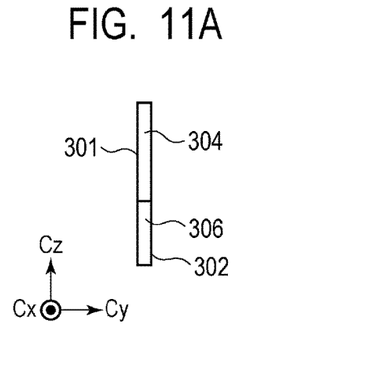
FIG. 11A and FIG. 11B are diagrams illustrating crystal axes of a crystal quartz according to a fourth embodiment.
Figure 11B:
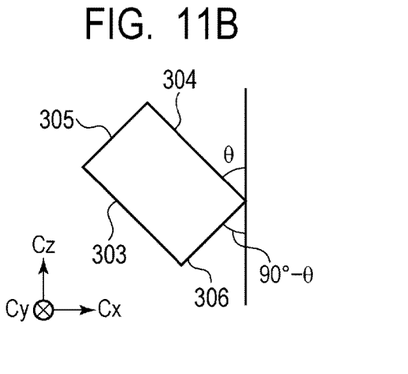
Figure 12:
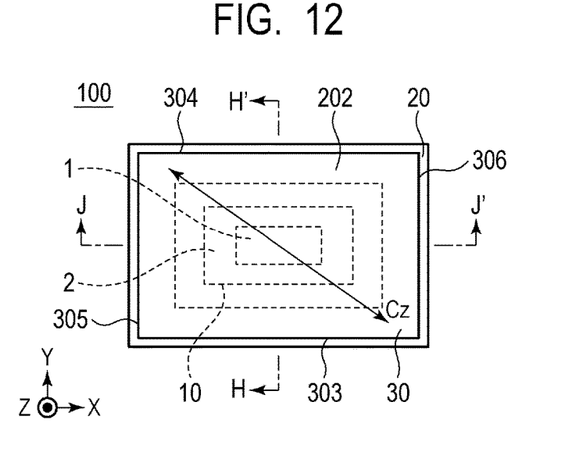
FIG. 12 is a schematic plan view of an electronic component according to the fourth embodiment.
Figure 13A:
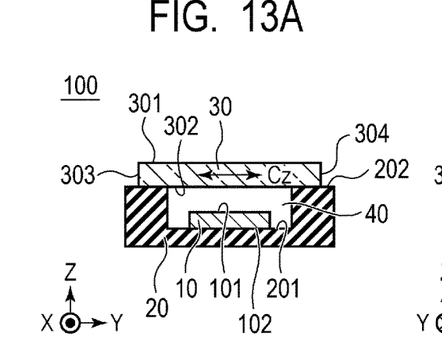
FIG. 13A and FIG. 13B are schematic sectional views of the electronic component according to the fourth embodiment.
Figure 13B:
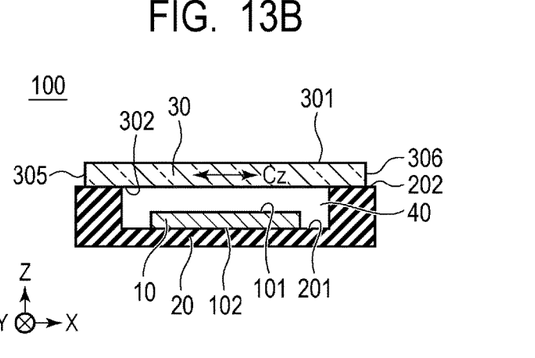

As a fourth embodiment of the present invention, an example of the structure of the electronic component 100 will be described below. The fourth embodiment is different from the first to third embodiments in the shape of the crystal quartz 30. Since other structure is common to the first embodiment, the description thereof will be omitted. FIG. 11A illustrates the crystal quartz 30 viewed from the positive direction of the electric axis Cx, and FIG. 11B illustrates the crystal quartz 30 viewed from the negative direction of the mechanical axis Cy. FIG. 12 is a schematic plan view of the electronic component 100. FIG. 13A is a schematic sectional view of the electronic component 100 taken along the line H-H' of FIG. 12, and FIG. 13B is a schematic sectional view of the electronic component 100 taken along the line J-J' of FIG. 12. The configuration of the fourth embodiment will be described below with cross-reference to these drawings.

The difference of the shape of the crystal quartz of the present embodiment from that of the first embodiment is in the shape of the side faces 305 and 306 of the crystal quartz 30. More specifically, each of the outer face 301 and the inner face 302 of the crystal quartz 30 is substantially parallel to the optical axis Cz, and none of the longer side and the shorter side of the outer face 301 and the inner face 302 is parallel to any of the electric axis Cx and the mechanical axis Cy.

As illustrated in FIG. 13A and FIG. 13B, each of the side faces 303, 304, 305, and 306 may be formed as a face perpendicular to the outer face 301 and the inner face 302. Also in this case, each of the side faces 303, 304, 305, and 306 is a face which is not parallel to the optical axis Cz. However, the side faces 303, 304, 305, and 306 may include a face which is not perpendicular to the outer face 301 and the inner face 302 as described in the first to third embodiments.

As illustrated in FIG. 11B, when each of the angles of the side faces 303 and 304 relative to the optical axis Cz is denoted as $\theta$ degrees, each of the angles of the side faces 305 and 306 relative to the optical axis Cz is $(90-\theta)$ degrees. As described above, the closer to perpendicular (90 degrees) the angle of each side face relative to the optical axis Cz is, the greater the effect of removing a flaw, a crack, or the like by wet etching is. On the other hand, when either each of the angles of the side faces 303 and 304 relative to the optical axis Cz or each of the angles of the side faces 305 and 306 relative to the optical axis Cz is close to 0 degree, the effect of wet etching is less likely to be obtained on the faces. In order to obtain a sufficient effect for all the side faces, it is preferable for $\theta$ to range from 30 degrees to 60 degrees. When $\theta$ is greater than or equal to 30 degrees and less than or equal to 60 degrees, $(90-\theta)$ is also greater than or equal to 30 degrees and less than or equal to 60 degrees. That is, all the side faces 303, 304, 305, and 306 form angles greater than or equal to 30 degrees and less than or equal to 60 degrees relative to the optical axis Cz. In particular, it is more preferable for the angles of the side faces 305 and 306 relative to the optical axis Cz to be substantially 60 degrees, because this enhances the effect of wet etching to the side faces 303 and 304 in the longer side direction that are subjected to a greater stress than the side faces 305 and 306 in the shorter side direction are.

Also in the present embodiment, similarly to the first embodiment, since none of the side faces of the crystal quartz 30 is parallel to the optical axis of the crystal quartz, wet etching of these side faces allows for effective removal of a defect such as a flaw or a crack. A use of the crystal quartz 30 obtained in such a way as a lid member of the electronic component 100 improves the strength of the lid member, and thereby the electronic component 100 with reduced occurrence of damage can be provided. Furthermore, in the present embodiment, since both of the outer face 301 and the inner face 302 of the crystal quartz 30 are parallel to the optical axis Cz, the number of crystal quartzes 30 cut out of the crystal quartz ingot of the same size increases. It is therefore possible to prepare the crystal quartz 30 and manufacture the electronic component 100 with lower cost, and thereby it is possible to further reduce the cost of the electronic component 100.

Other Embodiments

While the examples of the shape of the crystal quartz 30 have been described in the first to fourth embodiments, it is preferable for the thickness of the crystal quartz 30 in the direction perpendicular to the outer face 301 and the inner face 302 to be greater than or equal to 0.2 mm and less than or equal to 1.0 mm in each embodiment. The reasons are as follows. An insufficient thickness increases the amount of deformation of the crystal quartz 30 due to thermal expansion of the crystal quartz 30, a change in the internal pressure in the internal space 40, or the like caused by a change in the temperature. In particular, when the thickness is less than 0.2 mm, this increases the likelihood of the crystal quartz 30 being peeled from the base member 20 or the likelihood of the crystal quartz 30 being damaged, and thus the reliability of the electronic component 100 may not be maintained. On the other hand, when the thickness of the crystal quartz 30 is greater than 1.0 mm, the thickness of the electronic component 100 is unnecessarily increased, which may not sufficiently meet the commercial demand for reduction in the height.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, it should be appreciated that an embodiment in which a part of features of any of the embodiments is added to another embodiment or an embodiment in which a part of features of any of the embodiments is replaced with a part of features of another embodiment is also the embodiment to which the present invention can be applied.

This application claims the benefit of Japanese Patent Application No. 2017-052962, filed Mar. 17, 2017, which is hereby incorporated by reference herein in its entirety.

What is claimed is:

1. An electronic component comprising:
a base member;
an electronic device fixed on the base member; and
a lid member arranged over the electronic device and fixed on the base member,
wherein a primary material of the lid member is a crystal quartz,
wherein the lid member has two primary faces opposing to the electronic device and four side faces, and
wherein each of the four side faces is a wet-etched face that is not parallel to an optical axis of the crystal quartz.

2. An electronic component comprising:
a base member;
an electronic device fixed on the base member; and
a lid member arranged over the electronic device and fixed on the base member,
wherein a primary material of the lid member is a crystal quartz,
wherein the lid member has two primary faces opposing to the electronic device and four side faces,
wherein none of the four side faces is parallel to an optical axis of the crystal quartz, and
wherein at least one of the four side faces is not perpendicular to the two primary faces.

3. The electronic component according to claim 2, wherein each of the two primary faces has a quadrilateral shape, and
wherein the four side faces correspond to four sides of one of the two primary faces, respectively.

4. The electronic component according to claim 2, wherein each of two side faces of the four side faces forms an angle greater than or equal to 85 degrees and less than or equal to 95 degrees relative to the optical axis of the crystal quartz.

5. The electronic component according to claim 4, wherein the two side faces correspond to the longer sides of the two primary faces.

6. The electronic component according to claim 2, wherein, of the two primary faces, a primary face on the electronic device side forms an angle greater than or equal to 40 degrees and less than or equal to 50 degrees relative to the optical axis of the crystal quartz.

7. The electronic component according to claim 2, wherein each of two side faces of the four side faces forms an angle greater than or equal to 30 degrees and less than or equal to 60 degrees relative to the optical axis of the crystal quartz.

8. The electronic component according to claim 2, wherein a cross section of the lid member in a direction perpendicular to the two primary faces is a hexagon.

9. The electronic component according to claim 2, wherein a cross section of the lid member in a direction perpendicular to the two primary faces is a parallelogram which is not a rectangle.

10. The electronic component according to claim 2, wherein a cross section of the lid member in a plane perpendicular to the two primary faces is a trapezoid which is not a parallelogram.

11. The electronic component according to claim 10, wherein the longer side of bases of the trapezoid is included in a primary face of the two primary faces which is on the electronic device side.

12. The electronic component according to claim 10, wherein the shorter side of bases of the trapezoid is included in a primary face of the two primary faces which is on the electronic device side.

13. The electronic component according to claim 8, wherein, of the four side faces, two side faces through which the cross section passes are not perpendicular to the optical axis of the crystal quartz.

14. The electronic component according to claim 2, wherein each of the two primary faces forms an angle greater than or equal to −5 degrees and less than or equal to +5 degrees relative to the optical axis of the crystal quartz.

15. The electronic component according to claim 14, wherein each of the four side faces forms an angle greater than or equal to 30 degrees and less than or equal to 60 degrees relative to the optical axis of the crystal quartz.

16. The electronic component according to claim 2, wherein the lid member has a thickness greater than or equal to 0.2 mm and less than or equal to 1.0 mm in a direction perpendicular to the two primary faces.

17. The electronic component according to claim 2, wherein the electronic device is an image pickup device or a display device.

18. Electronic equipment comprising:
the electronic component according to claim 1; and
a casing in which the electronic component is embedded.

19. Electronic equipment comprising:
the electronic component according to claim 2; and
a casing in which the electronic component is embedded.

20. A manufacturing method of a lid member of a package for mounting an electronic device, the manufacturing method comprising:
preparing a crystal quartz plate having two primary faces and four side faces; and
wet-etching the four side faces,
wherein none of the four side faces is parallel to an optical axis of a crystal quartz.

* * * * *